United States Patent [19]

Dreps et al.

[11] Patent Number: 5,490,282
[45] Date of Patent: Feb. 6, 1996

[54] INTERFACE HAVING SERIALIZER INCLUDING OSCILLATOR OPERATING AT FIRST FREQUENCY AND DESERIALIZER INCLUDING OSCILLATOR OPERATING AT SECOND FREQUENCY EQUALS HALF FIRST FREQUENCY FOR MINIMIZING FREQUENCY INTERFERENCE

[75] Inventors: Daniel M. Dreps, Endicott; Raymond P. Rizzo, Vestal, both of N.Y.

[73] Assignee: International Business Machines Corporation, Armonk, N.Y.

[21] Appl. No.: 988,593

[22] Filed: Dec. 8, 1992

[51] Int. Cl.[6] .................................................. G06F 15/02
[52] U.S. Cl. ........................... 395/821; 395/800; 331/2; 341/100; 341/101; 375/359; 364/239.2; 364/240.3; 364/939.5; 364/DIG. 1
[58] Field of Search ................................... 395/275, 821, 395/800; 375/110, 121; 360/39, 51; 341/100, 101, 61; 364/602; 331/2

[56] References Cited

U.S. PATENT DOCUMENTS

| | | | |
|---|---|---|---|
| 1,795,393 | 3/1930 | Herman | 122/235.11 |
| 3,329,884 | 7/1967 | Gewartowski | 327/122 |
| 4,103,336 | 7/1978 | Gindi et al. | 364/900 |
| 4,575,744 | 3/1986 | Caldwell et al. | 357/45 |
| 4,634,987 | 1/1987 | Nolte | 327/122 |
| 4,679,003 | 7/1987 | Sagawa et al. | 331/25 |
| 4,720,688 | 1/1988 | Hasegawa et al. | 331/2 |
| 4,860,006 | 8/1989 | Barall | 370/85 |
| 5,069,522 | 12/1991 | Block et al. | 385/39 |
| 5,115,450 | 5/1992 | Arcuri | 375/98 |
| 5,268,937 | 12/1993 | Marbot | 375/121 |

Primary Examiner—Thomas C. Lee
Assistant Examiner—Moustafa M. Meky
Attorney, Agent, or Firm—Eugene I. Shkurko; William H. Steinberg

[57] ABSTRACT

A serial communication interface for sending and receiving serial data is provided including a serializer and a deserializer.

The serializer is designed so that the serializer VCO has a center frequency that is one half the center frequency of the deserializer VCO. The serializer uses both edges of the clock to mix the serial bits. The deserializer design is unchanged. The two VCO's are implemented on separate chips with both chips located on the same metallized ceramic substrate with a ground plane about 40 mm apart. Near frequency interaction is significantly reduced.

16 Claims, 4 Drawing Sheets

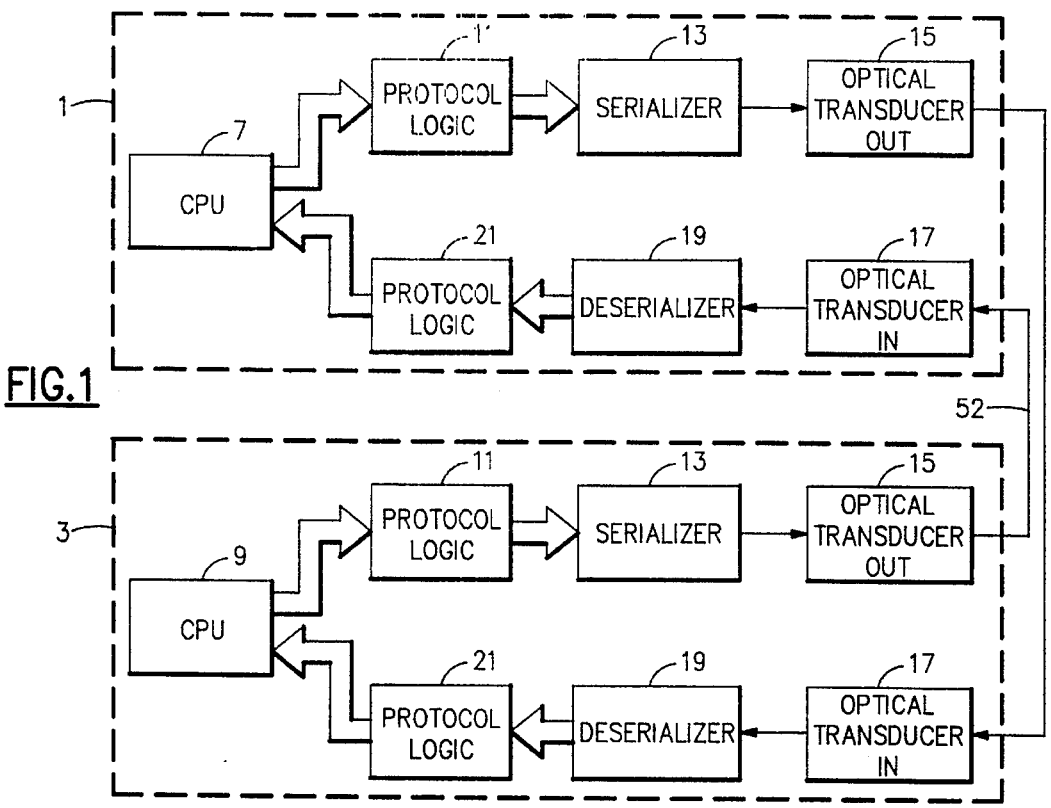
FIG.1
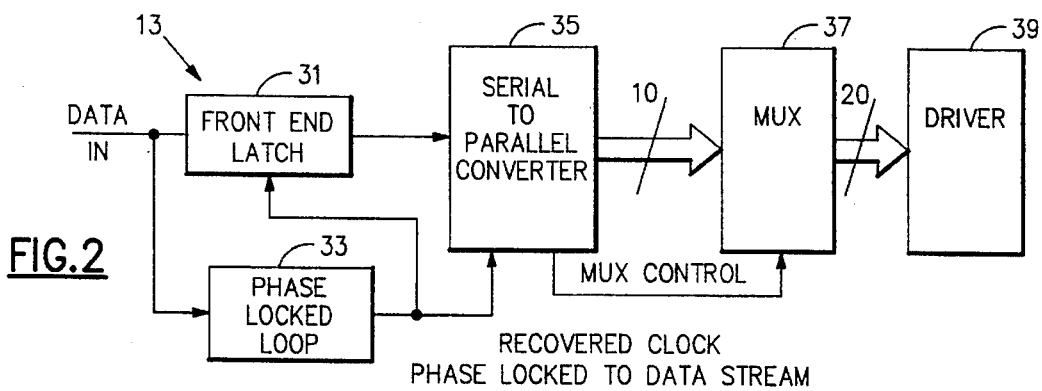
FIG.2
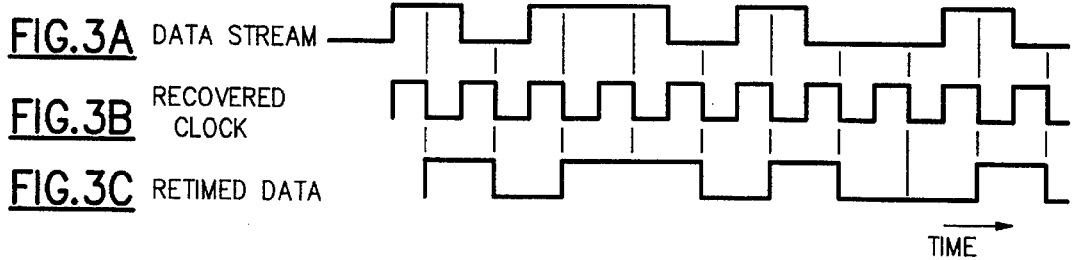
FIG.3A DATA STREAM
FIG.3B RECOVERED CLOCK
FIG.3C RETIMED DATA

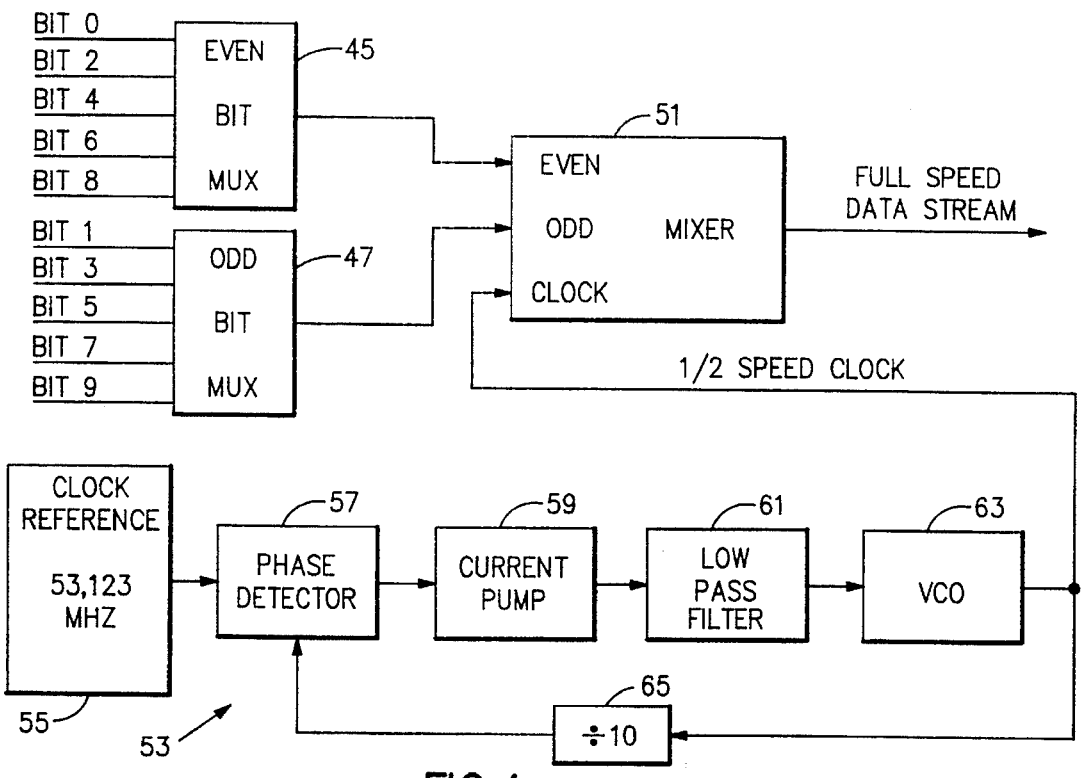
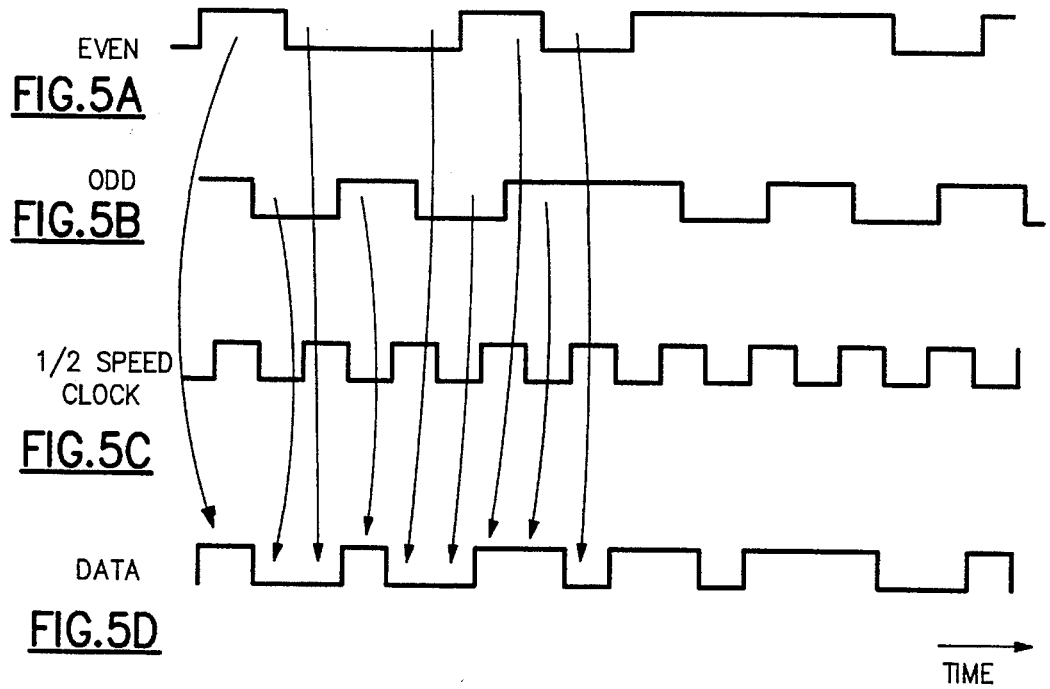

INTERFACE HAVING SERIALIZER INCLUDING OSCILLATOR OPERATING AT FIRST FREQUENCY AND DESERIALIZER INCLUDING OSCILLATOR OPERATING AT SECOND FREQUENCY EQUALS HALF FIRST FREQUENCY FOR MINIMIZING FREQUENCY INTERFERENCE

The present invention is related to application Ser. No. 07/987,224, abandoned in favor of continuing application 08/345,280, entitled "On-Chip Voltage Controlled Oscillator" assigned to the same assignee as the present invention and hereby incorporated by reference.

BACKGROUND OF THE INVENTION

The present invention relates to serializer deserializer functions used in data communications and more particularly to a serializer deserializer function fully integratable on a single module substrate.

Serializer deserializer modules use a deserializer voltage controlled oscillator, which is part of a phase locked loop, and which operates at a frequency which is the bit rate of the received serial bits to retime the serial bit stream. The serializer is used to generate the serial bit stream. The serializer VCO typically has the same center frequency as the deserializer VCO since data is sent at the same rate at which data is received in present data links. With the data being sent and received at the same rates buffering requirements are reduced. The input stage of latching by the deserializer is done with a full speed clock so all bits are clocked into the input latch transition at the same phase, relative to the data bit edges.

Due to "near-frequency" noise problems it is very difficult to fully integrate a complete serializer deserializer function on a single module substrate. One of the problems is the voltage controlled oscillators (VCOs), which are part of phase locked loops, running at the same frequency and in close proximity to one another tend to interact. This interaction can be in the form of power supply noise, substrate noise, and radiated RF noise.

It is an object of the present invention to provide a serializer deserializer circuit implementable on the same module substrate with substantially reduced near frequency noise generation between the VCO's of the serializer and deserializer.

It is a further object of the present invention to provide a serializer deserializer with reduced near frequency noise problems that is easily implementable using existing design procedures.

It is another object of the present invention to provide a serializer deserializer circuit implementable on a single module substrate which provides a deserializer VCO which has less output jitter.

It is still another object of the present invention to provide a serializer deserializer circuit implementable on a single module substrate which is extendable to multi-gigabit rates.

SUMMARY OF THE INVENTION

In one aspect of the present invention a serial communication interface for sending and receiving serial bit streams is provided including a deserializer for extracting a clock from the received serial bit stream, retiming the the data and performing the serial to parallel conversion. The deserializer includes an oscillator for generating the waveform used for extracting the clock and retiming the data. The serial communication interface also includes a serializer for converting data into serial form for sending a serial bit stream. The serializer includes a phase locked loop having a voltage controlled oscillator. The serializer voltage controlled oscillator has a center frequency of substantially half the center frequency of the deserializer voltage controlled oscillator, so that near frequency interference between the voltage controlled oscillators of the serializer and deserializer is minimized.

In another aspect of the present invention a method of sending and receiving serial data while avoiding near frequency interference between the serializer and deserializer is provided including the steps of retiming a serial stream of received data using a first clock signal having the same frequency as the data rate of the received data. Parallel data to be sent as serial data is mixed using both edges of a second clock signal which is half the clock rate of the first clock signal to provide a serial data stream having substantially the same rate as the received data stream.

BRIEF DESCRIPTION OF THE DRAWING

FIG. 1 is a block diagram of two computers each with a serial communication interface connected by a data link.

FIG. 2 is a block diagram of the deserializer of FIG. 1.

FIGS. 3A, 3B, and 3C are waveform diagrams on a common time scale for the data stream, recovered clock, and retimed data, respectively for FIG. 2.

FIG. 4 shows a block diagram of the serializer of FIG. 1 using a half speed clock for generating serial data in accordance with the present invention.

FIGS. 5A, 5B, 5C and 5D are waveform diagrams on a common time scale of even bits and odd bits to be serialized, half speed clock, and serialized data, respectively, of the serializer of FIG. 4.

DETAILED DESCRIPTION OF THE INVENTION

Figure 6:
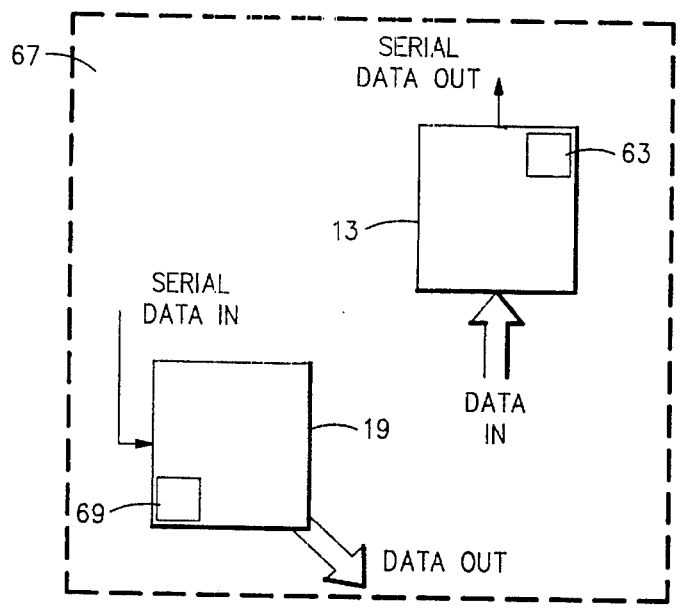
FIG. 6 is top view of a module substrate showing chip placement of the serializer and deserializer and their respective VCO's in accordance with the present invention.

Referring now to FIG. 1, two computers 1 and 3 each with a serial communication interface connected by a data link 52 are shown. Information from a CPU 7 and 9 in each of the computers 1 and 3, respectively, to be sent over the serial link 52 is sent as parallel data to the computer communication interface. Protocol logic 11 in the communication interface is used to set up transmission frames which are data structures which consist of fields predetermined by a protocol for the transmission of user data and control data. In addition to a data or information field, a frame has some kind of delimiter that marks its beginning and end and usually control fields, address information that identifies the source and destination and one or more check bits that allow the receiver to detect errors that may occur after the frame has been transmitted. The frames are sent to a serializer 13 which converts the parallel data into serial data which is provided to an optical transducer 15 to send optical signals over the optical link 52. Data from the serial data link is received by an optical transducer 17 which provides serial electrical data to a deserializer 19 which provides parallel data to protocol logic 21 which extracts the user data and control data, and checks on the data integrity. The information is then available to the other CPU.

Referring now to FIGS. 2 and 3A, 3B, and 3C a block diagram of the deserializer 19 including a clock recovery scheme for a data link is shown. Data is provided to a front end latch 31 and a phase locked loop 33. The phase locked loop 33 generates a phase locked clock signal, shown in FIG. 3B, from the data stream, shown in FIG. 3A, which runs at the bit rate of the data stream, and is phase locked to the stream in such a manner as to have one of its edges 180 degrees from data stream edges; in this way the recovered clock can then be used to sample the input data, through data latch 31 and reconstruct the data stream shown in FIG. 3C, by sampling at the midpoint of the data. By having the sampling occur at the midpoint of the data, the probability of the data being correct is greatest since in practice the input data has a great deal of edge jitter due to link signal attenuation between sender and receiver. The recovered clock is used by gate array logic to time in the serial bits into logic that converts the serials bits to parallel bytes. Ideally, the recovered phase locked loop used to make the recovered clock pattern will be responsive enough to phase lock onto the input data steam in a short period of time (2000 input bit times, for example) but will be lethargic enough to integrate edge jitter found in the input data stream to create a recovered clock with low edge jitter. Low jitter reduces the penalty associated with clock recovery, since logic timing and relative errors scale up as the base clock jitter increase. The serial retimed data stream is provided to a serial to parallel converter 35 which in the embodiment shown provides a parallel output of 10 bits wide and a multiplexer control signal. After the first 10 bits are sent to a multiplexer 37, the multiplexer sends the first 10 bits to a driver 39. Upon the multiplexer receiving the next 10 bits from the serial to parallel converter the multiplexer provides these bits as bits 11–20 to the driver.

Referring now to FIGS. 4 and 5A, 5B, 5C and 5D, a block diagram of a 10:1 serializer 13 using a half speed clock for generating serial data and the waveforms associated with the serializer, are shown. The input width may be other even multiples with the same techniques applied. The even bits to be serialized are supplied to an even bit multiplexor 45 and the odd bits are supplied to an odd bit multiplexor 47. The output of the even bit multiplexor 45 is supplied to one input of a mixer 51 and the output of the odd bit multiplexor is provided to another input of mixer 51. A half speed clock, which is set to be half the speed of the recovered clock used in the deserializer 13, is used to drive the mixer 51 to provide the full speed data stream by using the positive edge of the half speed clock to shift the even bits out and the negative edge of the half speed clock to shift the odd bits out. The half speed clock is generated by a phase locked loop circuit 53 which is driven by a clock reference 55 which is set to 1/10 to the desired half speed clock. The clock reference is provided to a phase detector 57 which compares two input frequencies and generates a binary output based on the phase difference of the input frequencies. A current charge pump 59 is used to convert the voltage pulses from the phase detector 57 to current pulses which drive a low pass filter 61. The charge pump 59 delivers a current of +I or –I to the loop filter 61 whenever the phase detector logic state is high or low, respectively. When there are no output pulses from the detector the charge pump is isolated from the loop filter, enabling a zero static phase error at steady state. A voltage controlled oscillator 63 is responsive to the dc signal from the low pass filter and provides the half speed clock which is 10 times the clock reference 55. The half speed clock is provided to mixer 51 and to a divide by ten circuit 65. The output of the divide by ten circuit 65 provides one of the inputs to the phase detector 57.

FIG. 5A shows the waveform of the even bits supplied to mixer 51, FIG. 5B shows the waveform of the odd bits provided to the mixer 51, and FIG. 5C shows the waveform of the half speed clock provided to mixer 51. The full speed serialized data stream provided by the serializer is shown in FIG. 5D. In order to insure proper functioning, the even bits must never transition when the positive pulse of the the clock exists and the odd bits must never transition when the negative pulse of the the clock exists. This can be accomplished, as will be appreciated by those having ordinary skill in the art, by using relative delay blocks causing timing shifts.

Since both edges of the waveform of the serializer VCO 63 which is part of a phase locked loop which generates the half speed clock is being used, the symmetry of the waveforms generated by the serializer VCO is important to achieve the desired data transmission rates. An example of a VCO that can generate an output frequency waveform with less than 2% symmetry error is described and claimed in copending application Serial No. 07/987,224, abandoned in favor of continuing application 08/345,280, still pending entitled "On-Chip Voltage Controlled Oscillator".

Package design, circuit design, and chip layout all influence the robustness of a design that must operate in a noisy environment. Chip isolation, power supply filtering and separation using module substrates with ground planes and physical separation are used to reduce coupling, however, these steps tend to be secondary importance in reducing the interaction between VCO's. Circuit design is the primary factor in determining interaction between the VCO's.

Referring now to FIG. 6 chip placement of a serializer 13 and deserializer 19 on a common module substrate 67 is shown. To eliminate the module substrate coupling between VCO 63 of the serializer 13 and VCO 69 of the deserializer 19 the serializer and deserializer functions are separated into two separate chips. The chips are positioned on a diagonal of a module substrate 67 with the VCO function of each of the chips implemented in corners of the chips. By implementing the VCOs in the corners of the chips circulating current in the chip substrate which can cause noise problems is minimized. The corners are also shown situated on the diagonal with the corners of the chip selected to be the ones that are the farthest apart. While this may not always be possible, the separation between the VCOs should be kept as far apart as is practicable. The module substrate 67 is preferably a metallized substrate with ground plane.

The dominant frequency interaction between the VCO's of the serializer and the deserializer tends to occur at the fundamental frequency. By setting the frequency of the serializer to half the frequency of the deserializer the cumulative effect of the two fundamental frequencies and the discrete harmonics are not effected.

Figure 7:
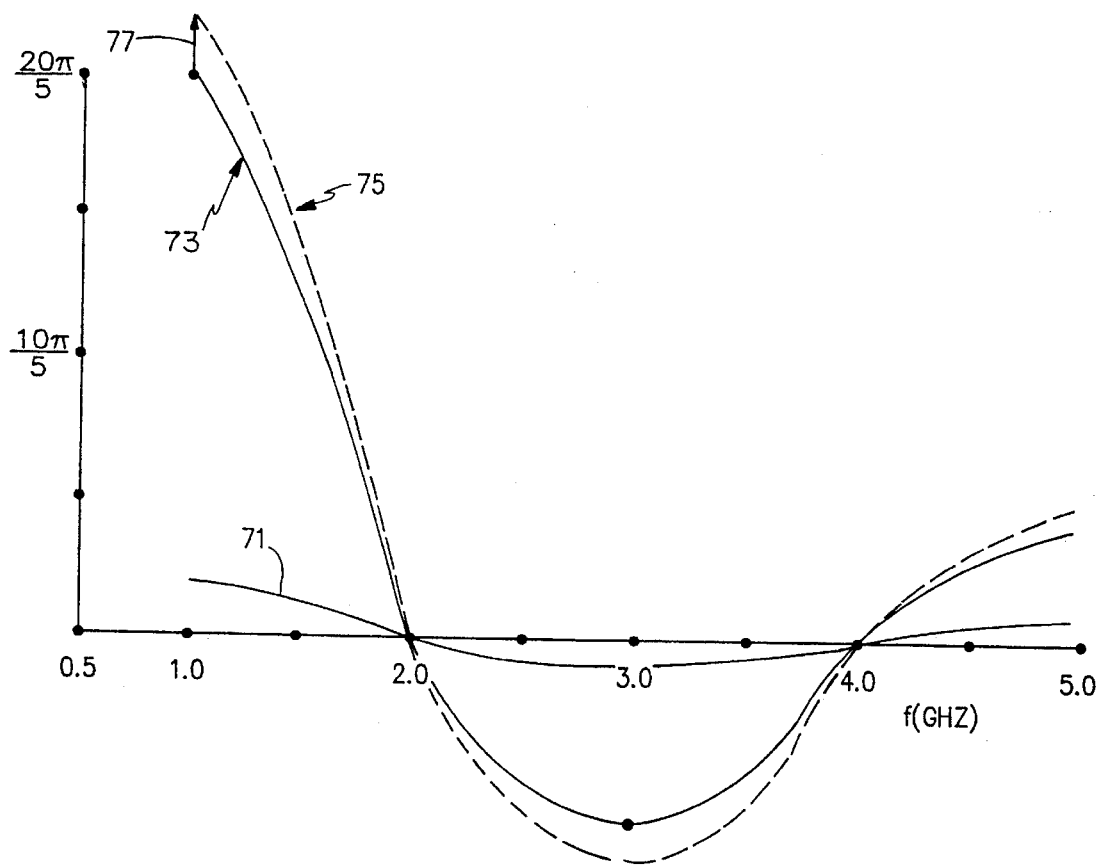
FIG. 7 shows the relative comparisons of the unit amplitudes of the cumulative spectrum for a serializer and deserializer VCOs as a function of multiples of the center frequency of the deserializer, where the VCO's have the same center frequency and the "K" factor representing relative coupling is 10%.

FIG. 7 shows the relative comparisons of the cumulative spectrum for a serializer deserializer where the VCO's have the same center frequency and the "K" factor representing relative coupling, given as a percentage is 10%. The curve labelled with reference numeral 71 is the serializer VCO amplitude as a function of frequency adjusted by a K factor of 10%. The curve labelled by reference numeral 73 is the deserializer amplitude as a function of frequency. Dashed curve 75 is the sum of curve 71 and 73. Relative coupling between the VCO's is a function of position with 100% coupling occurring when one VCO is placed directly on top of the other VCO. As can be seen in FIG. 7 with a 10% coupling factor there is a 10% interaction at the fundamental frequency of the VCO's shown by reference numeral 77 when they are operated at the same center frequency.

Figure 8:
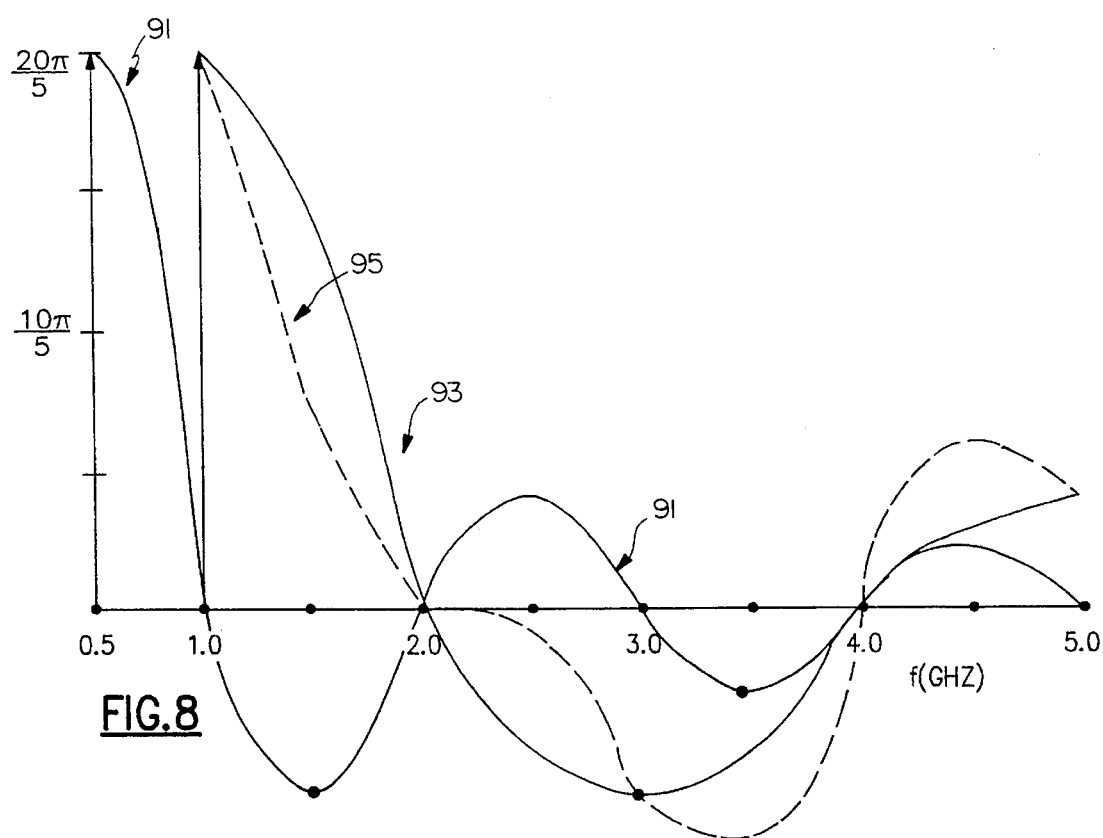
FIG. 8 shows the relative comparisons of the unit amplitudes of the cumulative spectrum for a serializer and deserializer VCOs as a function of multiples of frequency of the deserializer where the serializer VCO frequency is half the deserializer center frequency and the "K" factor representing relative coupling is 100%.

FIG. 8 shows a graph of cumulative continuous spectrum of the serializer and deserializer center frequencies where the serializer VCO frequency is half of the deserializer frequency with 100% coupling. The curve labelled with reference numeral 91 is the serializer VCO amplitude as a function of frequency adjusted by a K factor of 100%. The curve labelled by reference numeral 93 is the deserializer amplitude as a function of frequency. Dashed curve 95 is the sum of curve 91 and 93. Note that the fundamental and odd harmonics are not effected by the 100% coupling. With no magnitude change at the fundamental frequency of the deserializer.

Figure 9:
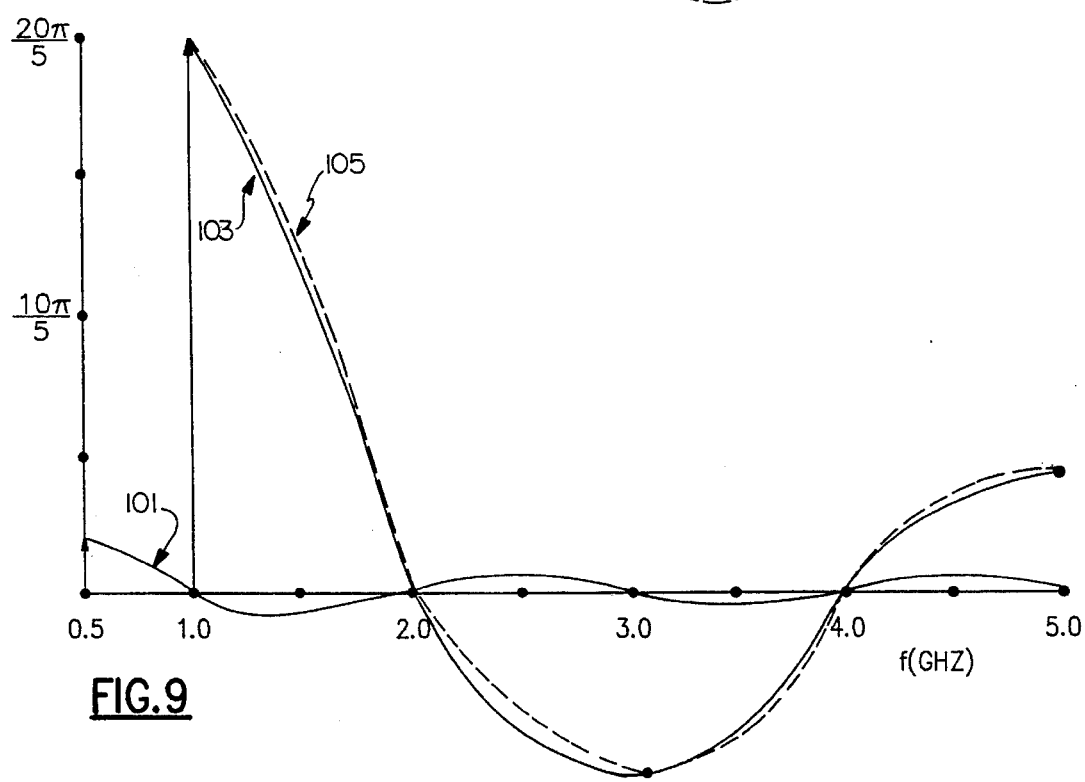
FIG. 9 shows the relative comparisons of the unit amplitudes of the cumulative spectrum for a serializer and deserializer VCOs as a function of multiples of frequency of the deserializer where the serializer VCO frequency is half the deserializer center frequency and the "K" factor representing relative coupling is 10%.

FIG. 9 shows a graph of cumulative continuous spectrum of the serializer and deserializer center frequencies where the serializer VCO frequency is half of the deserializer frequency with 10% coupling. The curve labelled with reference numeral 101 is the serializer VCO amplitude as a function of frequency adjusted by a K factor of 10%. The curve labelled by reference numeral 103 is the deserializer amplitude as a function of frequency. Dashed curve 105 is the sum of curve 101 and 103. Note that the fundamental and odd harmonics are not effected by the coupling, with very little effect noted elsewhere in the spectrum.

The foregoing has described a serializer deserializer circuit implementable on the same module substrate with substantially reduced near frequency noise generation between the VCO's of the serializer and deserializer. The circuit is extendable to multi-gigabit rates.

While the invention has been particularly shown and described with reference to a preferred embodiment thereof, it will be understood by those skilled in the art that various changes in form and details may be made therein without departing from the spirit and scope of the invention. For example, while a voltage controlled oscillator in a phase locked loop has been shown in connection with the deserializer, other types of oscillators can be used to generate a clock signal such as surface acoustic wave oscillator if a large phase lock time can be tolerated or a ring oscillator if the large gain of the oscillator would not cause a problem.

What is claimed is:

1. A serial communication interface for sending and receiving serial data, comprising:

a deserializer for recovering a clock from received serial data, retiming the received serial data, and performing serial to parallel conversion of the received serial data, said deserializer including a first oscillator operating at a first frequency for generating a first clock signal used to retime the received serial data; and a serializer for converting received parallel data into serial form and for sending the received data in a serial data stream, said serializer including a second oscillator operating at a second frequency of substantially half the first frequency of the first oscillator for minimizing near-frequency interference between the first and second oscillators, and for generating a second clock signal used to send the serial data stream by clocking the received data with both edges of the second clock signal.

2. The serial communication interface of claim 1 wherein said serial data is sent and received as optical signals over a fiber optic link and converted to electrical signals.

3. The serial communication interface of claim 1 wherein said deserializer and serializer are implemented on a common module substrate.

4. The serial communication interface of claim 3 wherein said serializer and deserializer are implemented on separate chips situated on said module substrate.

5. The serial communication interface of claim 4 wherein said serializer and deserializer chips are positioned with diagonally opposite corners of the chips located on a module substrate diagonal.

6. The serial communication interface of claim 5 wherein the first oscillator and the second oscillator are each situated in one of said diagonally opposite corners of said deserializer and serializer chips, respectively, such that the first and second oscillators are farthest apart.

7. The serial communication interface of claim 3 wherein said module substrate comprises a metallized ceramic substrate.

8. The serial communication interface of claim 1 wherein said first and second oscillators each comprise a voltage controlled oscillator in a phase locked loop.

9. A computer having a serial communication interface for sending and receiving serial data over a serial link, comprising:

a deserializer for extracting a clock from received serial data, retiming the received serial data, and performing serial to parallel conversion of the received serial data, said deserializer including a first oscillator operating at a first frequency for generating a clock signal used to retime the received serial data;

a CPU;

first protocol logic coupled to said CPU and to said deserializer for distinguishing user data and control data from retimed data received from the deserializer, and for providing the retimed data to the CPU;

second protocol logic coupled to said CPU for receiving and framing parallel data from said CPU; and a serializer coupled to said second protocol logic for converting the parallel data into serial form and for sending the parallel data in a serial data stream over said serial link, said serializer including a second oscillator operating at a second frequency of substantially half the first frequency so that near-frequency interference between the first and second oscillators is minimized.

10. The computer of claim 9 wherein said deserializer and serializer are implemented on a common module substrate.

11. The computer of claim 10 wherein said serializer and deserializer are implemented on separate chips situated on said module substrate.

12. The computer of claim 11 wherein said serializer and deserializer chips are positioned with diagonally opposite corners of the chips located on a module substrate diagonal.

13. The computer of claim 12 wherein the first oscillator and the second oscillator are each situated in one of said diagonally opposite corners of said deserializer and serializer chips, respectively, such that the first and second oscillators are farthest apart.

14. The computer of claim 10 wherein said module substrate comprises a metallized ceramic substrate.

15. The computer of claim 9 wherein said first and second oscillators each comprise a voltage controlled oscillator in a phase locked loop.

16. A method of operating a serial communication interface having a serializer and a deserializer while avoiding near frequency interference between the serializer and deserializer, comprising the steps of:

providing the deserializer with a first oscillator operating at a first frequency;

providing the serializer with a second oscillator operating at a second frequency which is substantially half the first frequency of the deserializer;

retiming a first serial data stream received by the deserializer using a first clock signal provided by the first oscillator and having substantially the same frequency as a data rate of the first serial data stream;

separating bits of parallel data to be sent as a second serial data stream; and mixing separated bits of the parallel data including using both edges of a second clock signal provided by the second oscillator and having substantially half the frequency of the first clock signal to provide the second serial data stream at substantially the same data rate as the first serial data stream.

\* \* \* \* \*